(12) United States Patent
Lee et al.

(10) Patent No.: US 10,217,234 B2
(45) Date of Patent: Feb. 26, 2019

(54) MODELING METHOD AND APPARATUS USING THREE-DIMENSIONAL (3D) POINT CLOUD

(71) Applicant: SAMSUNG ELECTRONICS CO., LTD., Suwon-si (KR)

(72) Inventors: Kyoobin Lee, Seoul (KR); Seung-Chan Kim, Hwaseong-si (KR); Sunghoon Hong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 40 days.

(21) Appl. No.: 15/638,518

(22) Filed: Jun. 30, 2017

(65) Prior Publication Data

US 2018/0211399 A1   Jul. 26, 2018

(30) Foreign Application Priority Data

Jan. 26, 2017 (KR) .................. 10-2017-0012363

(51) Int. Cl.
*G06T 9/00* (2006.01)
*G06T 7/529* (2017.01)
*G06T 7/536* (2017.01)
*G06T 7/13* (2017.01)
*G06F 17/50* (2006.01)

(52) U.S. Cl.
CPC .............. *G06T 7/529* (2017.01); *G06F 17/50* (2013.01); *G06T 7/13* (2017.01); *G06T 7/536* (2017.01)

(58) Field of Classification Search
CPC ........... G06T 7/529; G06T 7/13; G06T 7/536; G06T 7/0046; G06F 17/50; G06F 17/18; G06F 17/5009; G06F 3/4842; G06F 2217/16
See application file for complete search history.

(56) References Cited

U.S. PATENT DOCUMENTS

| 7,774,158 B2 | 8/2010 | Domingues Goncalves et al. |
| 8,775,630 B2 * | 7/2014 | Zhang ................... G06F 9/5044 709/223 |

(Continued)

FOREIGN PATENT DOCUMENTS

| EP | 2854104 A1 | 4/2015 |
| KR | 10-1423139 B1 | 7/2014 |

(Continued)

OTHER PUBLICATIONS

Engel, Jakob, et al. "LSD-SLAM: Large-Scale Direct Monocular SLAM." *European Conference on Computer Vision*. Springer International Publishing, 2014. (16 pages, in English).

(Continued)

*Primary Examiner* — Amir Alavi
(74) *Attorney, Agent, or Firm* — NSIP Law

(57) ABSTRACT

A modeling method using a three-dimensional (3D) point cloud, the modeling method including extracting at least one region from an image captured by a camera; receiving pose information of the camera based on two-dimensional (2D) feature points extracted from the image; estimating first depth information of the image based on the at least one region and the pose information of the camera; and generating a 3D point cloud to model a map corresponding to the image based on the first depth information.

24 Claims, 8 Drawing Sheets

(56) References Cited

U.S. PATENT DOCUMENTS

| | | | |
|---|---|---|---|
| 8,855,819 | B2 | 10/2014 | Choi et al. |
| 9,243,916 | B2 | 1/2016 | Roumeliotis et al. |
| 9,329,598 | B2 | 5/2016 | Pack et al. |
| 9,390,344 | B2 | 7/2016 | Pirchheim et al. |
| 2012/0114175 | A1* | 5/2012 | Hwang .............. G06K 9/00208 382/103 |
| 2014/0267700 | A1 | 9/2014 | Wang et al. |
| 2014/0300775 | A1* | 10/2014 | Fan .................... H04N 5/23229 348/231.3 |
| 2014/0320593 | A1 | 10/2014 | Pirchheim et al. |
| 2014/0328519 | A1* | 11/2014 | Martinetz ............. G06T 7/0046 382/107 |
| 2015/0154806 | A1* | 6/2015 | Ogale .................... G06T 19/20 345/419 |
| 2016/0012588 | A1 | 1/2016 | Taguchi et al. |
| 2016/0253807 | A1* | 9/2016 | Jones .................... G06T 7/0046 382/154 |
| 2016/0335796 | A1* | 11/2016 | Roimela ................. G06T 17/05 |
| 2017/0249401 | A1* | 8/2017 | Eckart ................. G06F 17/5009 |
| 2018/0144458 | A1* | 5/2018 | Xu .......................... G06T 7/004 |
| 2018/0211399 | A1* | 7/2018 | Lee ......................... G06T 7/529 |

FOREIGN PATENT DOCUMENTS

| | | |
|---|---|---|
| KR | 10-2016-0000873 A | 1/2016 |
| KR | 10-2016-0001699 A | 1/2016 |
| WO | WO 2015/090420 A1 | 6/2015 |

OTHER PUBLICATIONS

Klein, Georg, et al. "Parallel Tracking and Mapping for Small AR Workspaces." *Mixed and Augmented Reality, 2007. ISMAR 2007. 6th IEEE and ACM International Symposium on.* IEEE, 2007. (10 pages, in English).

Krombach, Nicola, et al. "Combining Feature-based and Direct Methods for Semi-dense Real-time Stereo Visual Odometry". 14th International Conference on Intelligent Autonomous Systems (IAS), Shanghai, China, Jul. 2016. Autonomous Intelligent Systems Group, University of Bonn. (13 pages in English).

Mur-Artal, Raúl, et al. "ORB-SLAM: Tracking and Mapping Recognizable Features." *MVIGRO Workshop at Robotics Science and Systems (RSS)*, Berkeley, USA. 2014. (6 pages, in English).

Newcombe, Richard A., et al. "DTAM: Dense Tracking and Mapping in Real-Time." *Computer Vision (ICCV), 2011 IEEE International Conference on.* IEEE, 2011. (8 pages, in English).

Song,Jae-Bok, et al.. "Past and State-of-the-Art SLAM Technologies". Mechanical Engineering, Korea University. 2014. (8 pages in Korean).

Yang, Shichao, et al. "Pop-up SLAM: Semantic Monocular Plane SLAM for Low-Texture Environments." Intelligent Robots and Systems (IROS), 2016 IEEE/RSJ International Conference on. IEEE, 2016. (8 pages, in English).

\* cited by examiner

MODELING METHOD AND APPARATUS USING THREE-DIMENSIONAL (3D) POINT CLOUD

CROSS-REFERENCE TO RELATED APPLICATION

This application claims the benefit under 35 USC § 119(a) of Korean Patent Application No. 10-2017-0012363 filed on Jan. 26, 2017, in the Korean Intellectual Property Office, the entire disclosure of which is incorporated herein by reference for all purposes.

BACKGROUND

1. Field

The following description relates to a modeling method and apparatus using a three-dimensional (3D) point cloud.

2. Description of Related Art

A simultaneous localization and mapping (SLAM) scheme simultaneously constructs a map of an environment based on sensor information and estimates a current position from the map. A visual SLAM (vSLAM) scheme uses a camera and sensors, and includes a feature-based vSLAM scheme that matches and tracks relatively robust features present between images. The vSLAM also includes a direct-based vSLAM scheme that generates a position and ambient space map based on maintenance of photometric consistency on an image.

In the feature-based vSLAM scheme, a 6-degree of freedom (DoF) position is accurately determined in a generated three-dimensional (3D) map. However, the map is generated sparsely, thereby making it difficult to obtain space information in a space with few features.

In the direct-based vSLAM scheme, a 3D map is generated densely. However, an accuracy of a position of the camera is relatively low.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a modeling method using a three-dimensional (3D) point cloud, the modeling method includes extracting at least one region from an image captured by a camera; receiving pose information of the camera tracked based on two-dimensional (2D) feature points extracted from the image; estimating first depth information of the image based on the at least one region and the pose information of the camera; and generating a 3D point cloud to model a map corresponding to the image based on the first depth information.

The pose information of the camera may include either one or both of a key frame corresponding to the image and a pose variation that changes in response to a movement of the camera from a first position to a second position.

The estimating may include determining, based on the pose information of the camera, whether to either one or both of replacing the key frame with a new key frame and redefining the key frame in response to the movement of the camera from the first position to the second position; and estimating either one or both of depth information related to the new key frame and depth information related to the redefined key frame to be the first depth information of the image based on a result of the determining.

The determining may include replacing a key frame with respect to the at least one region with the new key frame in response to the pose information of the camera that changes in response to the movement of the camera being greater than or equal to a preset pose variation; and redefining the key frame, with respect to the at least one region, in response to the pose information of the camera that changes in response to the movement of the camera being less than the preset pose variation.

The replacing may include replacing depth information related to the new key frame by projecting points corresponding to the key frame with respect to the at least one region on the new key frame.

The redefining may include redefining depth information related to the key frame by filtering pixels of the key frame combined with an interleaved spatial regularization through a baseline stereo comparison.

The modeling method may further include fusing the first depth information and second depth information estimated based on the 2D feature points, wherein the generating comprises generating the 3D point cloud for modeling the map corresponding to the image based on the fused depth information.

The fusing may include fusing the first depth information and the second depth information by adding the second depth information to the first depth information.

The extracting may include searching the image for at least one region including a portion having an intensity gradient variation corresponding to a first-order differential of a pixel intensity exceeding a preset reference value.

The modeling method may further include reconstructing a 3D surface of the image based on the 3D point cloud.

The modeling method may further include extracting parameters for modeling a target object from the 3D point cloud; and modeling the target object based on the parameters.

According to another general aspect, a modeling method using a three-dimensional (3D) point cloud includes detecting an edge from an image captured by a camera; receiving information related to two-dimensional (2D) feature points extracted from the image; analyzing a 2D contour included in the image based on the edge and the information related to the 2D feature points; receiving pose information of the camera that is tracked based on the 2D feature points; generating a 3D point with respect to at least a portion of the 2D contour by performing curve fitting with respect to a 3D space corresponding to the 2D contour based on a result of the analyzing and the pose information of the camera; and generating a 3D point cloud for modeling a map corresponding to the image by fusing a 3D point estimated based on the 2D feature points and the 3D point generated by curve fitting.

The analyzing may include analyzing whether 2D feature points, of which 3D coordinates are verified through depth estimation, are positioned on or adjacent to a 2D contour of the edge by matching coordinates of the 2D feature points to the edge; and determining 3D coordinates of 2D feature points positioned on, or adjacent to the 2D contour, based on the 2D feature points of which the 3D coordinates are verified.

The generating of the 3D point may include projecting 3D points of a 3D curve, predicted through the 2D contour on a 2D image, based on the pose information of the camera, an intrinsic parameter of the camera, and the 2D feature points of which the 3D coordinates are verified; calculating a coefficient of a curve parameter of the 3D curve that minimizes an error of an error function with respect to the 3D points projected on the 2D image, the error of the error function being zero when the 3D points projected on the 2D image match the 2D contour; and performing curve fitting with respect to the 3D space of the 2D feature points based on the coefficient of the curve parameter of the 3D curve.

The error function may be based on at least one of a 3D point corresponding to any one or any combination of any two or more of a frame of the image, the intrinsic parameter of the camera, and the pose information of the camera.

The analyzing may include obtaining a set of 2D curvatures corresponding to the 2D contour by analyzing the edge; determining whether a curvature of the edge exceeds a preset curvature and a length of the edge exceeds a preset contour length; and generating a contour library including any one or any combination of any two or more of coordinates of 2D feature points matched to the edge, the length of the edge, and the curvature of the edge based on a result of the determining.

The modeling method may further include reconstructing a 3D surface of the image based on the 3D point cloud.

The modeling method may further include extracting parameters for modeling a target object from the 3D point cloud; and modeling the target object based on the parameters.

A non-transitory computer-readable medium may store program instructions for controlling a processor to perform the method.

According to another general aspect, a modeling apparatus using a three-dimensional (3D) point cloud includes a communication interface configured to receive pose information of a camera that is tracked based on two-dimensional (2D) feature points extracted from an image captured by the camera; and a processor configured to extract at least one region from the image, to estimate first depth information of the image based on the at least one region and the pose information of the camera, and to generate a 3D point cloud for modeling a map corresponding to the image based on the first depth information.

A modeling method using a three-dimensional (3D) point cloud, the modeling method includes generating a first depth information, the first depth information being generated based on an identified edge of at least a region of an image captured by a camera; receiving an estimated second depth information, based on an identified two-dimensional (2D) point of the region of the image captured by the camera; fusing the second depth information with the first depth information; and, generating a 3D point cloud to model a map of the region of the image based on the fused first and second depth information.

The second depth information may be generated based on a comparison of pose information of the camera and positions of identified 2D feature points amongst a plurality of images captured by the camera.

The first depth information may be generated based on a detected edge within the image, the edge being analyzed as a 2D contour transformatively applied as a 3D curve through successive approximations.

The modeling method may further include transformatively projecting modified imagery comprising reconstructed 3D surfaces of the image based on the map of the region of the image to generate either one or both of a virtual reality and an augmented reality view for a user.

Other features and aspects will be apparent from the following detailed description, the drawings, and the claims.

Figure 1:
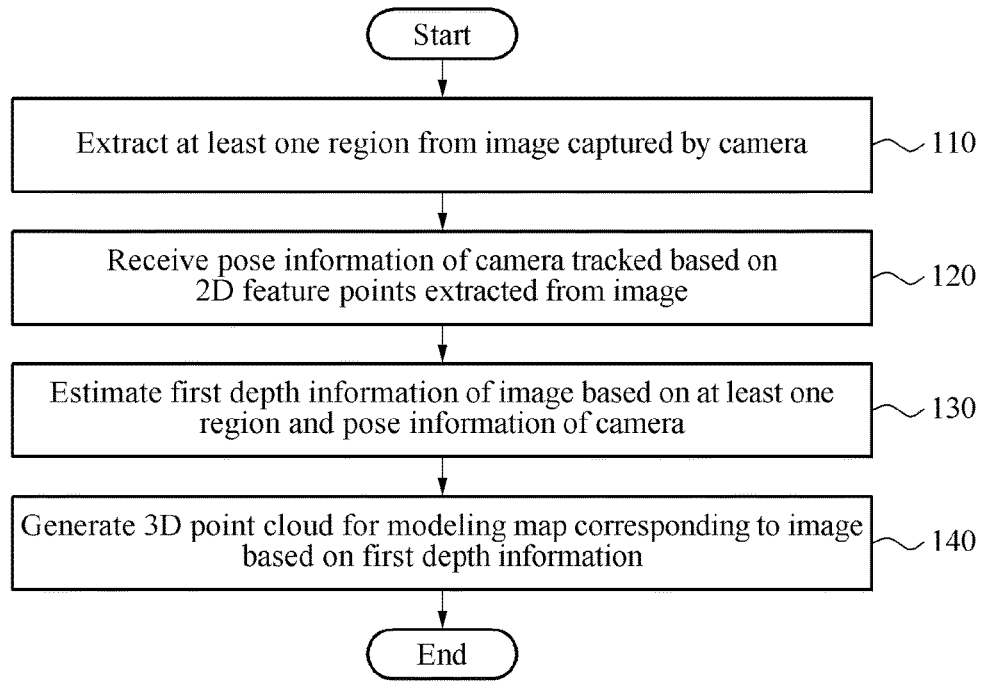
FIG. 1 is a flowchart illustrating a modeling method using a three-dimensional (3D) point cloud, in accordance with an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various alterations and modifications may be made to the examples. Here, the examples are not construed as limited to the disclosure and should be understood to include all changes, equivalents, and replacements within the idea and the technical scope of the disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing. The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the fields of Virtual Reality (VR) and Augmented Reality (AR) (which seeks to transformatively combine the real-world with computer-generated imagery or visual indicia), such a system must be able to determine location and pose information of the wearer, identify surroundings, generate a reliable 3D map including depth information (oftentimes from a single monocular camera devoid of native depth information), and identify different objects, surfaces, shapes, and regions of the surroundings. Only then can a VR/AR system generate reconstructed imagery and project it into the field of view of a user in precise geometric and temporal alignment with the actual world surrounding the user to maintain an illusion of uniformity.

Embodiments set forth hereinafter may be used to reconstruct a surface of an image or model a target object based on a three-dimensional (3D) point cloud in augmented reality (AR), virtual reality (VR), or complex reality in which AR and VR are mixed. In one or more embodiments, modified imagery comprising reconstructed 2D and/or 3D surfaces of the image based on the map of the region of the image are transformatively projected to generate either one or both of a virtual reality and an augmented reality view for a user.

The embodiments may be implemented as various types of products such as a smart phone, a smart home appliance, an intelligent vehicle, a wearable device, and a head-mounted display. For example, the embodiments may be applied to a smart phone, a mobile device, a smart home system, and a wearable device to reconstruct a surface of an image or model and provide a virtual object. Hereinafter, the embodiments will be described in detail with reference to the accompanying drawings, wherein like drawing reference numerals are used for like elements.

FIG. 1 is a flowchart illustrating a modeling method using a 3D point cloud, in accordance with an embodiment. A modeling apparatus using a 3D point cloud, hereinafter, the "modeling apparatus" in accordance with an embodiment may be implemented as one or more hardware modules. Referring to FIG. 1, in operation 110, the modeling apparatus extracts at least one region from an image captured by a camera. For instance, the modeling apparatus searches for and extracts at least one region including a portion, for example, an edge, with a gradient variation corresponding to a first-order differential result of a pixel intensity or light intensity of the image exceeding a preset reference value. In some embodiments, the modeling apparatus detects the edge by utilizing the first-order differential result and/or a second-order differential result with respect to the pixel intensity of the image. In this example, the camera may be a monocular camera or a stereo camera. The image captured by the camera may include a plurality of frames.

In operation 120, the modeling apparatus receives pose information of the camera that is tracked based on two-dimensional (2D) feature points extracted from the image captured by the camera. The pose information of the camera includes, for example, a key frame corresponding to the image or a pose variation that changes in response to a movement of the camera from a first position to a second position. In one example, the "key frame" corresponds to two frames of which 2D feature points are extracted, among general frames, and having at least a predetermined number of matches, such that a relative position between images may be determined.

For example, a great amount of operation time is needed to extract positions of feature points, extract a descriptor, match feature points using the descriptor, or calculate a pose of the camera. It is difficult to perform the corresponding process for each image, and thus the above process may be performed using the key frame.

In this example, the 2D feature points extracted from the captured image correspond to sparse feature points, and are extracted using a feature-based visual simultaneous localization and mapping (vSLAM) method that calculates a position of a camera and geometric information related to a scene of an image. The feature-based vSLAM method tracks 6-degree of freedom (DoF) movement information between frames corresponding to the image based on the extracted 2D feature points. The pose information of the camera includes, for example, 6-DoF pose information. A method of tracking a pose of a camera based on 2D feature points is described further with reference to FIG. 3.

In operation 130, the modeling apparatus estimates first depth information of the image based on the extracted at least one region and the received pose information of the camera. The modeling apparatus determines, based on the pose information of the camera, whether to replace the key frame corresponding to the image to a new key frame or redefine the key frame in response to the movement of the camera from the first position to the second position. The modeling apparatus estimates one of depth information related to the new key frame or depth information related to the redefined key frame to be the first depth information of the image based on a result of the determining.

In operation 140, the modeling apparatus generates a 3D point cloud for modeling a map corresponding to the image based on the first depth information. The map corresponding to the image is expressed by a pose graph of key frames. The key frames are constructed by the image, an inverse depth map, and a variance of the inverse depth map. In monocular SLAM, a depth uncertainty is not modeled well by Gaussian. Thus, instead of the classical X,Y,Z expression, an inverse depth is used to map and express features. The "inverse depth map" corresponds to a map in which features are mapped using the inverse depth.

Further, the inverse depth map and the variance of the inverse depth map are defined with respect to a subset of pixels. The inverse depth map and the variance of the inverse depth map correspond to all regions each having a gradient variation of the pixel intensity exceeding the preset reference value in the image.

The 3D point cloud includes, for example, points having 3D coordinates, that is, 3D points. The 3D points in the point cloud are constructed to be non-uniform.

Figure 2:
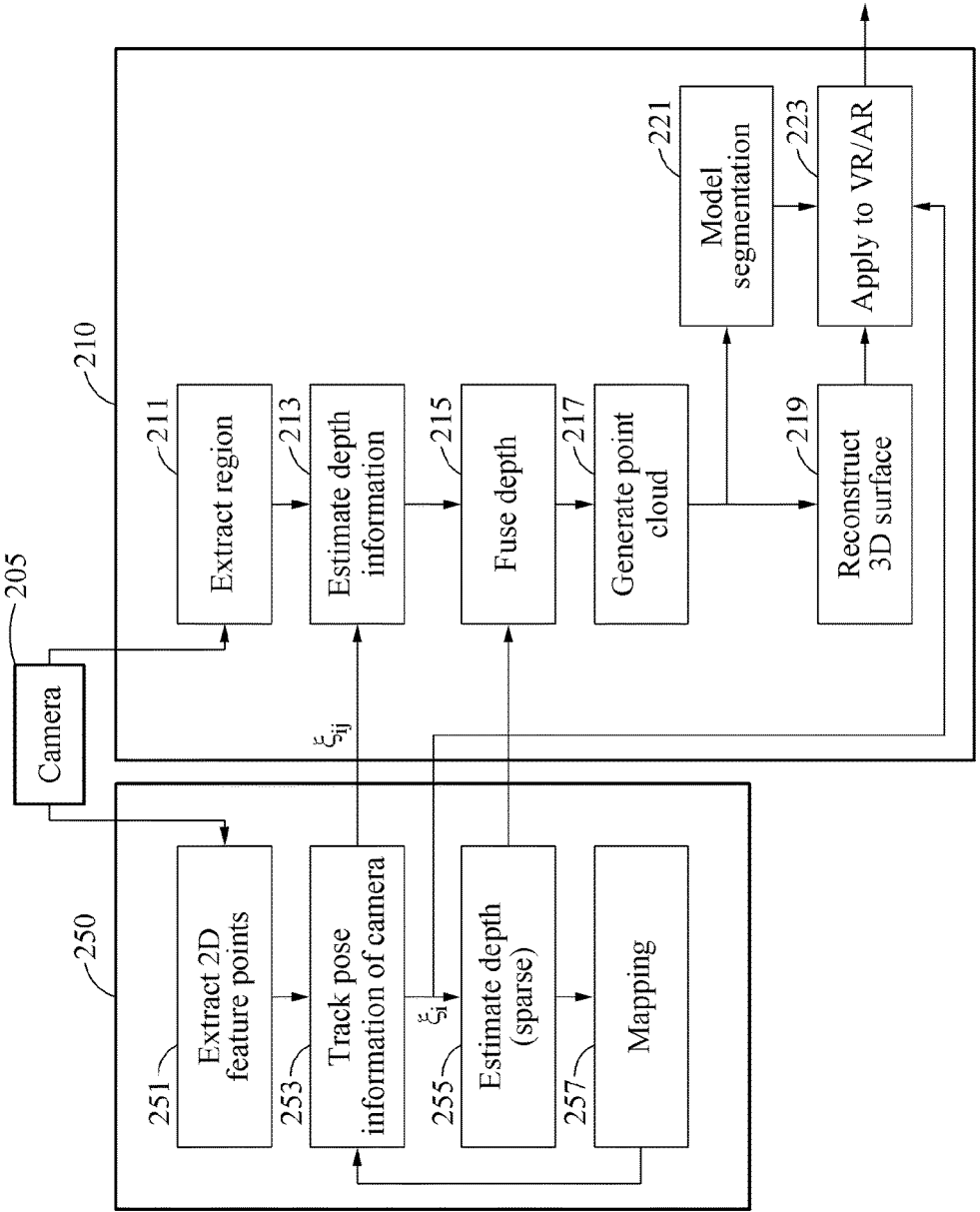
FIG. 2 is a diagram illustrating an operation of a modeling apparatus using a 3D point cloud, in accordance with an embodiment.

FIG. 2 is a diagram illustrating an operation of a modeling apparatus using a 3D point cloud in accordance with an embodiment. Referring to FIG. 2, a camera 205, a modeling apparatus 210, and a feature-based vSLAM apparatus 250 are illustrated.

The vSLAM apparatus 250 detects a 6-DoF position of the camera 205 in real time, and simultaneously generates a sparse map of an ambient space through operations 251 through 257. The modeling apparatus 210 generates a 3D point cloud through operations 211 through 217, and applies the 3D point cloud to VR and/or AR through operations 219 through 223.

The detailed operation of the vSLAM apparatus 250 is as follows.

When an image captured by the camera 205 is received, the vSLAM apparatus 250 extracts essential 2D feature points from the image, in operation 251. In this example, the image captured by the camera 205 includes a plurality of consecutive frames.

In operation 253, the vSLAM apparatus 250 calculates an invariant feature descriptor from the extracted feature points, and tracks a pose $\xi$ of the camera 205 by matching the feature descriptor to features present in the consecutive frames. To determine the pose of the camera 205, a Lie algebra $\xi \in \mathfrak{se}(3)$ is used. The pose of the camera 205 has a relationship of $\xi \in \mathfrak{se}(3)$ with respect to a Euclidean group SE(3) that is used in kinematics of a rigid body.

In operation 253, the vSLAM apparatus 250 transmits, to the modeling apparatus 210, pose information $\xi_{ij}$ of the camera 205 that changes in response to a movement, for example, from a frame i to a frame j. Here, the pose information $\xi_{ij}$ is a pose vector that expresses a translation to move a point from the frame i to the frame j, that is, a relative pose variation of the frame j with respect to the frame i.

The vSLAM apparatus 250 estimates depth information of the image captured by the camera 205 using a structure of 3D points and a motion of the camera 205 calculated using epipolar geometry in operation 255, and maps the depth information to a map corresponding to the image in operation 257. A result of the mapping in operation 257 is transmitted to operation 253 and used to track the pose information of the camera 205.

For reference, epipolar geometry represents a relationship among points, lines, and planes generated when a single point P in a 3D space is projected on respective image planes of two cameras $O_L$ and $O_R$ that capture the point P. For example, the point P is projected on a point $P_L$ positioned on the image plane of the left camera $O_L$, and is projected on a point $P_R$ positioned on the image plane of the right camera $O_R$. In this example, the point P, the two cameras $O_L$ and $O_R$, and the points $P_L$ and $P_R$ positioned on the image planes of the cameras $O_L$ and $O_R$ are all positioned on the same plane. In this example, a straight line connecting positions of the cameras $O_L$ and $O_R$ may be referred to a "baseline".

The vSLAM apparatus 250 provides the modeling apparatus 210 with depth information, for example, second depth information, estimated based on the 2D feature points in operation 255.

The modeling apparatus 210 discerns a structure and a motion of a 3D point directly from the image itself, rather than information extracted from the image, for example, an extracted 2D feature point. The modeling apparatus 210 calculates the structure and the motion of the 3D point through a gradient variation of pixel intensity with respect to a portion of regions of the image.

The operation of the modeling apparatus 210 is as follows. When the image captured by the camera 205 is received, the modeling apparatus 210 extracts at least one region from the image, in operation 211.

In operation 213, the modeling apparatus 210 estimates first depth information of the image based on the extracted at least one region and the pose information $\xi_{ij}$ of the camera 205 received from the vSLAM apparatus 250. The modeling apparatus 210 estimates the first depth information using a rectification and small baseline stereo-matching method that matches epipolar lines using a relative position difference between images, based on the pose information $\xi_{ij}$ of the camera 205.

In operation 215, the modeling apparatus 210 fuses the estimated first depth information and the second depth information received from the vSLAM apparatus 250. As described above, the first depth information has a relatively low accuracy but is relatively dense, and the second depth information has a relatively high accuracy but is relatively sparse. For example, the modeling apparatus 210 fuses the first depth information and the second depth information by adding the sparse second depth information to the dense first depth information. The modeling apparatus 210 fuses the first depth information and the second depth information by replacing at least a portion of the first depth information with the second depth information or updating at least a portion of the first depth information based on the second depth information.

In operation 217, the modeling apparatus 210 generates a 3D point cloud for modeling a map corresponding to the image based on the fused depth information. In operation 219, the modeling apparatus 210 reconstructs a 3D surface of the image based on the generated 3D point cloud.

Together with or separate from the reconstruction of the 3D surface of the image, the modeling apparatus 210 models a target object through model segmentation, in operation 221. The modeling apparatus 210 extracts parameters for modeling the target object from the 3D point cloud, and models the target object based on the extracted parameters. The target object includes, for example, a plane, a line, a sphere, a cylinder, and a non-uniform rational basis spline (NURBS) surface.

For example, the target object to be modeled is a plane having plane information ax+by+c=d. The modeling apparatus 210 extracts parameters of a planar model, for example, parameters a, b, c, and d, in the 3D point cloud, and models the plane by separating point(s) corresponding to the parameters in the 3D point cloud.

The modeling apparatus 210 models various target objects, for example, a wall and a floor, by iteratively performing the above process. The modeling apparatus 210 models the target object by extracting the parameters of the planar model, for example, using schemes such as RANdom SAmple Consensus (RANSAC), Least Median of Squares (LMS), M-Estimator SAmple Consensus (MESAC), and PROgressive SAmple Consensus (PROSAC).

In operation 223, the modeling apparatus 210 models various target objects, for example, a wall and a floor by iteratively performing the above process, and utilizes the target objects for application of AR or VR.

In an embodiment, the modeling apparatus 210 and the vSLAM apparatus 250 operate by different system clocks.

As described above, the modeling apparatus 210 uses the second depth information estimated based on the 2D feature points extracted by the vSLAM apparatus 250, without detection of 2D feature points and direct calculation of an invariant feature descriptor of each 2D feature point. Based on the second depth information estimated based on the 2D feature points and the pose information of the camera 205 tracked based on the 2D feature points, the modeling apparatus 210 obtains a high-quality, semi-dense 3D point cloud to be used for 3D space modeling.

The modeling apparatus 210 easily obtains information of a model having a featureless surface or surface with weak features such as a wood grain or a top of a desk, for example, plane information ax+by+c=d. In this example, the 3D point cloud generated by the modeling apparatus 210 includes dense dummy points including points with weak features. The modeling apparatus 210 generates a surface map and/or a target object from the 3D point cloud by removing noise or stochastic errors of points, for example, through RANSAC model fitting.

Figure 3:
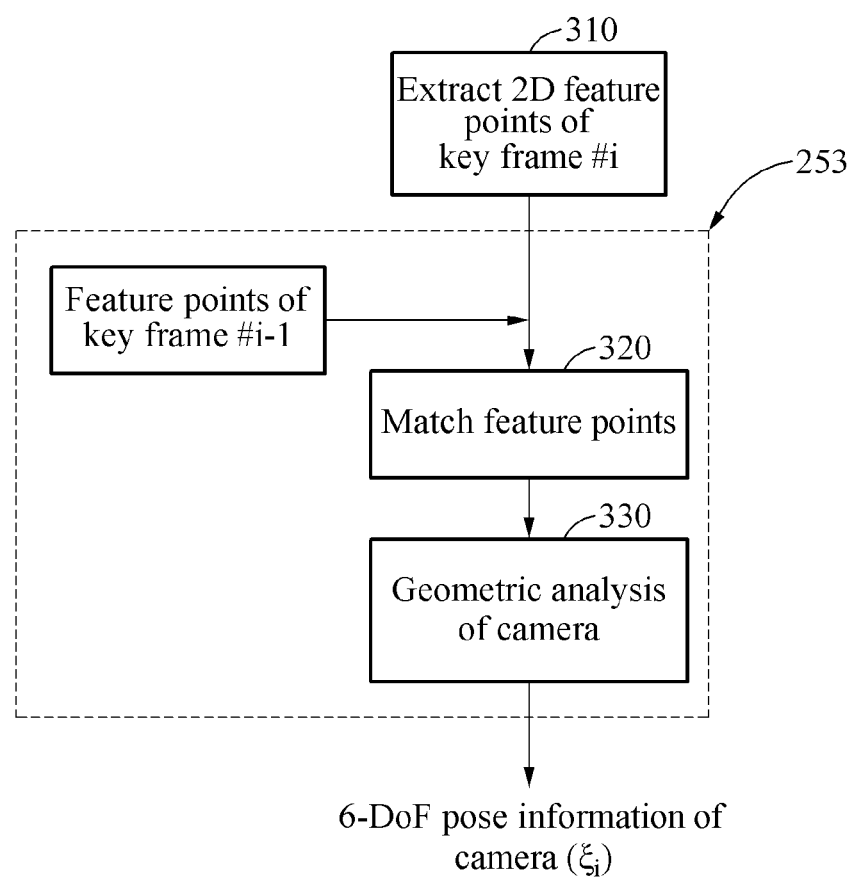
FIG. 3 is a diagram illustrating an operation of tracking a pose of a camera in the example of FIG. 2.

FIG. 3 is a diagram illustrating an example of operation 253 of tracking a pose of a camera in the example of FIG. 2. Referring to FIG. 3, an operation of a vSLAM apparatus for tracking pose information of a camera is illustrated.

When 2D feature points are extracted from a key frame i of an image captured by a camera in operation 310, the vSLAM apparatus matches 2D feature points present in a key frame i-1 and the key frame i in operation 320. In operation 320, the vSLAM apparatus calculates an invariant feature descriptor from the 2D feature points extracted from the key frame i-1 and the key frame i, and matches the feature descriptor to 2D feature points present in consecutive frames. In this example, the key frame i-1 and the key frame i are consecutive frames in a single image.

In operation 330, the vSLAM apparatus tracks 6-DoF pose information $\xi_i$ of the camera corresponding to the key frame i through an epipolar geometric analysis of the camera based on a result of the matching in operation 320.

Figure 4:
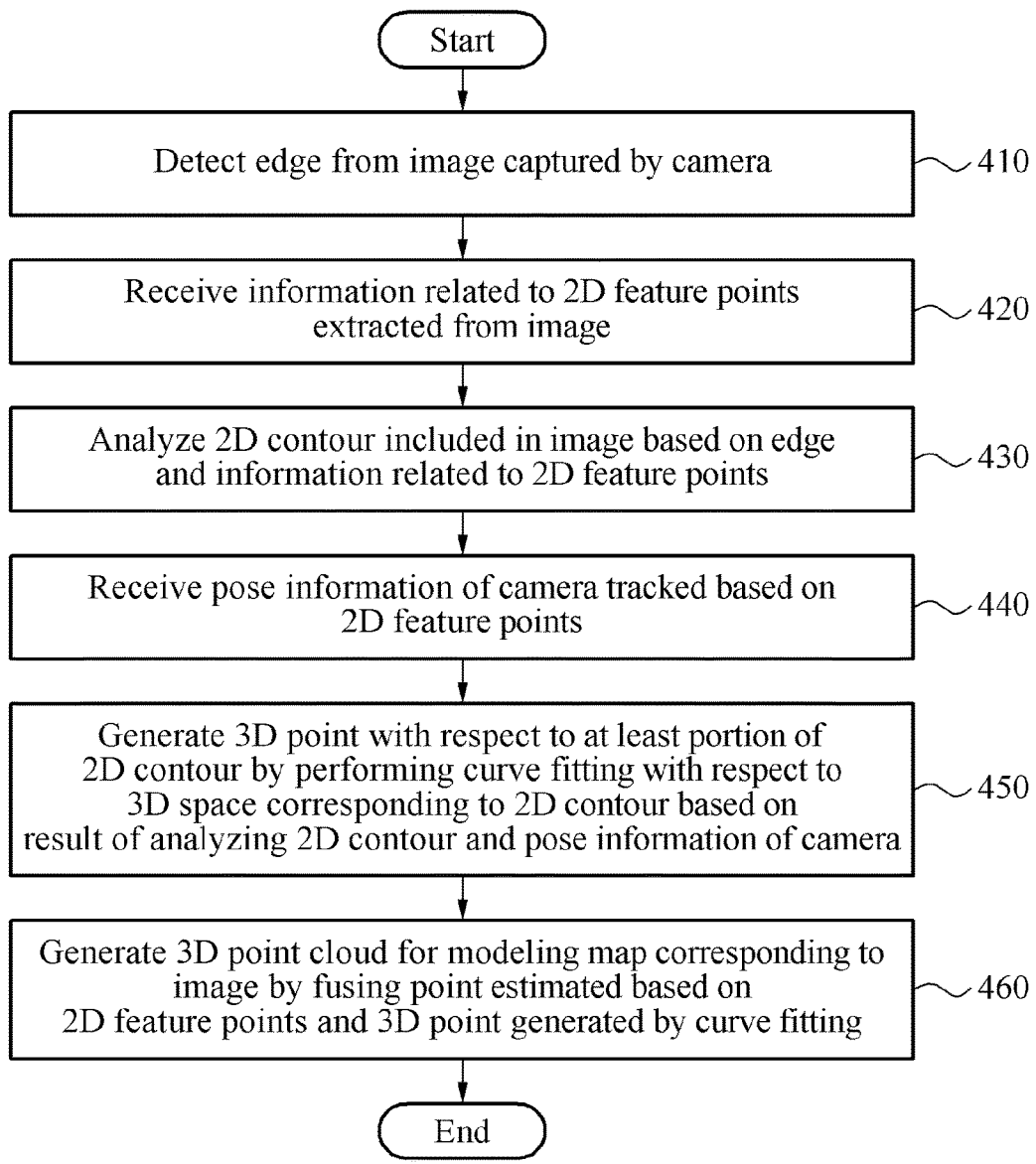
FIG. 4 is a flowchart illustrating a modeling method using a 3D point cloud, in accordance with an embodiment.

FIG. 4 is a flowchart illustrating an example of a modeling method using a 3D point cloud in accordance with an embodiment. Referring to FIG. 4, in operation 410, a modeling apparatus detects an edge from an image captured by a camera. The detected edge includes a plurality of points and/or contours corresponding to a boundary line or outline in which a change in light is greater than or equal to a threshold. The detected edge corresponds to a set of multiple contours.

In operation 420, the modeling apparatus receives information related to 2D feature points extracted from the image. In this example, the 2D features include features and 2D coordinates corresponding to the features. The information related to the 2D feature points received in operation 420 is used later to identify start points and end points of the 2D contours included in the image.

In operation 430, the modeling apparatus analyzes a 2D contour included in the image based on the edge and the information related to the 2D feature points. The modeling apparatus obtains a plurality of 2D contours based on adjacency between a plurality of points included in the edge. A 2D contour is a 2D curve. Further, the modeling apparatus analyzes whether 2D feature points of which 3D coordinates are verified through depth estimation are positioned on or adjacent to a 2D contour of the edge by matching coordinates of the 2D feature points to the edge. In this example, the 3D coordinates of the 2D feature points are verified through depth estimation performed by a vSLAM apparatus.

In a case in which the 2D feature points are positioned on or adjacent to the same 2D contour as a result of the analyzing in operation 430, the modeling apparatus determines the 2D feature points to be points to be connected to each other and corresponding to the same 2D contour, that is, points constituting a 3D curve. In a case in which the 2D feature points are positioned on or adjacent to the 2D contour, the modeling apparatus determines 3D coordinates for the 2D feature points positioned on or adjacent to the 2D contour corresponding to a portion of the contour using the 2D feature points of which the 3D coordinates are verified through depth estimation.

In a case in which the 2D feature points are not adjacent to the same 2D contour as the result of the analyzing, the modeling apparatus determines the 2D feature points to be points not to be connected to each other, that is, separate points not corresponding to the same 2D contour. The modeling apparatus identifies start points and end points of the 2D contours based on the 2D feature points.

Further, the modeling apparatus obtains a set of 2D curvatures corresponding to the 2D contours by analyzing the edge. In a case in which 2D feature points are included in a value of each curvature, the modeling apparatus obtains 3D information, for example, 3D coordinates, of pixels constituting a 2D curvature through map information received from the vSLAM apparatus. Here, "the case in which 2D feature points are included in a value of each curvature" refers to a case in which the 2D feature points are positioned on the 2D contour of the edge, or the 2D feature points are positioned within a predetermined distance from the 2D contour of the edge.

The modeling apparatus determines whether a curvature of each 2D contour exceeds a preset curvature and a length of each 2D contour exceeds a preset 2D contour length.

In a case in which the curvature of the 2D contour exceeds the preset curvature and the length of the corresponding 2D contour exceeds the preset 2D contour length as a result of the determining, the modeling apparatus incorporates the corresponding 2D contour in a contour library. For example, the modeling apparatus generates the contour library including at least one of coordinates of 2D feature points matched to the corresponding 2D contour, the length of the corresponding 2D contour, or the curvature of the corresponding 2D contour.

In operation 440, the modeling apparatus receives pose information of the camera tracked based on the 2D feature points. In operation 450, the modeling apparatus generates a 3D point with respect to at least a portion of the 2D contour by performing curve fitting approximations with respect to a 3D space corresponding to the 2D contour based on the result of analyzing the 2D contour and the pose information of the camera. In this example, the modeling apparatus performs curve fittings with respect to each 2D contour of the edge. The 3D point generated by the modeling apparatus is a 3D point included in a point cloud. A method of performing curve fitting using the modeling apparatus will be described further with reference to FIG. 5.

In operation 460, the modeling apparatus generates a 3D point cloud for modeling a map corresponding to the image by fusing the 3D point estimated based on the 2D feature points and the 3D point generated by curve fitting.

Figure 5:
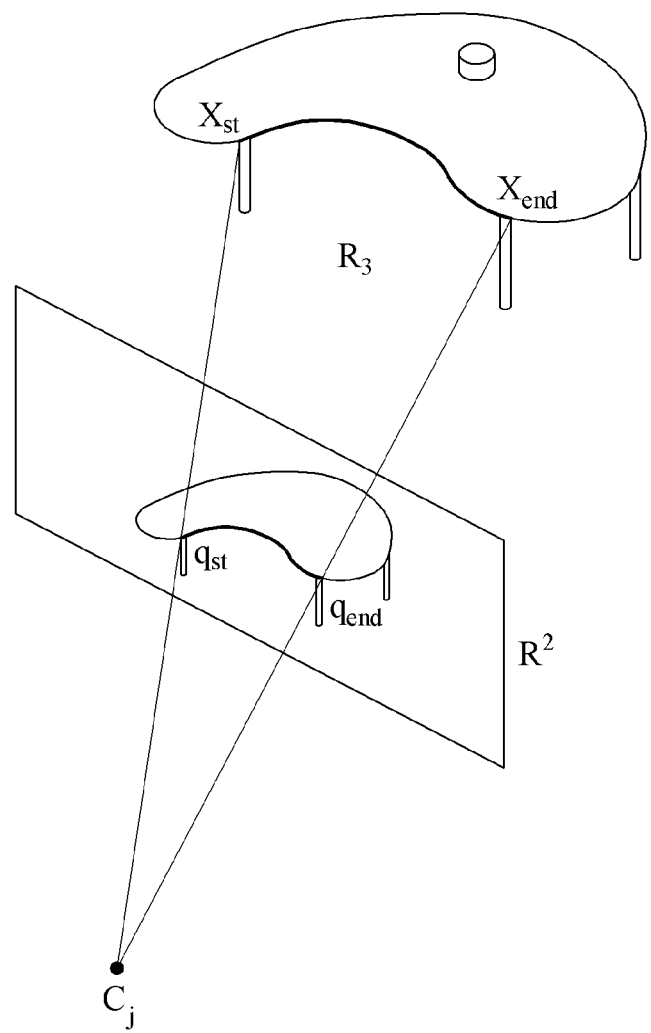
FIG. 5 is a diagram illustrating a method to generate a point by performing curve fitting in the example of FIG. 4.

FIG. 5 is a diagram illustrating an example of a method of generating a 3D point by performing curve fitting in the example of FIG. 4. Referring to FIG. 5, a process of performing curve fitting with respect to a frame j at a j-th position from a reference frame at a predetermined moment is illustrated.

In FIG. 5, $C_j$ denotes a principal point with respect to the frame j. $q_{st}$ and $q_{end}$ denote 2D feature points corresponding to a start point and an end point of a 2D contour corresponding to a portion of an edge. $X_{st}$ and $X_{end}$ denote 3D points, for example, expected 3D corresponding points, corresponding to the 2D contour in a 3D space.

The modeling apparatus performs curve fitting with respect to a 3D space of the 2D feature points $q_{st}$ and $q_{end}$ based on 3D information of at least two 2D feature points obtained through the map information received from the vSLAM apparatus.

In this example, an error function E of curve fitting with respect to the frame j is defined as expressed by Equation 1.

$$E^j = \sum_i \|q_i - P(K, \xi_j, X_i^j)\|^2 \qquad \text{[Equation 1]}$$

In Equation 1, $q_i$ denotes a 2D feature point captured in an image, and i denotes an i-th point on a curve. $P(K, \xi_j, X_i^j)$ denotes a function to represent an expected 3D corresponding point.

K in a function P denotes an intrinsic parameter of the camera, and is on the premise that it is invariant during a curve fitting process. The intrinsic parameter of the camera includes, for example, a focal length, a principal point, and a skew coefficient. $\xi_j$ denotes 6-DoF pose information of the camera with respect to the j-th frame relative to a predetermined frame, and $X_i^j$ denotes an i-th 3D point of a j-th view. $\xi_j$ is received from the vSLAM apparatus. $X_i^j$ is determined by an expected 3D curve parameter. Here, the 3D curve parameter corresponds to, for example, a general 3D curve parameter such as a spline or a Bezier curve.

The modeling apparatus re-projects the expected 3D corresponding points K, $\xi_j$, and $X_i^j$ on a 2D image region using the function P. Here, to "re-project" is to project an image represented in a 3D space on a 2D space again. That is, the modeling apparatus projects 3D points of a 3D curve predicted through a 2D contour on a 2D image based on the pose information of the camera, the intrinsic parameter of the camera, and the 2D feature points of which 3D coordinates are verified.

The modeling apparatus optimizes the error function to reduce a re-projection error with respect to observation in many views from the frame i to the frame j, as expressed by Equation 2. A process of minimizing the error of the error function is referred to as an "optimization process".

The error of the error function becomes zero (0) when the 3D points projected on the 2D image match the 2D contour. The error function is expressed as given by Equation 2.

[Equation 2]

$$\min \sum_i \sum_j \|q_i^j - P(K, \xi_j, X_j^i)\|^2.$$

An optimization issue of the error function expressed by Equation 2 is solved, in one or more embodiments, using the well-known Levenberg-Marquardt algorithm.

The modeling apparatus calculates a coefficient of a curve parameter of the 3D curve that minimizes, in a 2D space, errors among the pose information of the camera, the 2D feature points $q_{st}$ and $q_{end}$, and the expected 3D corresponding points $X_{st}$ and $X_{end}$ corresponding to the 2D contour of the edge projected in the 3D space. For example, a multi-degree polynomial, a spline, or a Bezier curve is used as the 3D curve.

The modeling apparatus performs curve fitting with respect to the 3D space of the 2D feature points using the coefficient of the curve parameter of the 3D curve.

Figure 6:
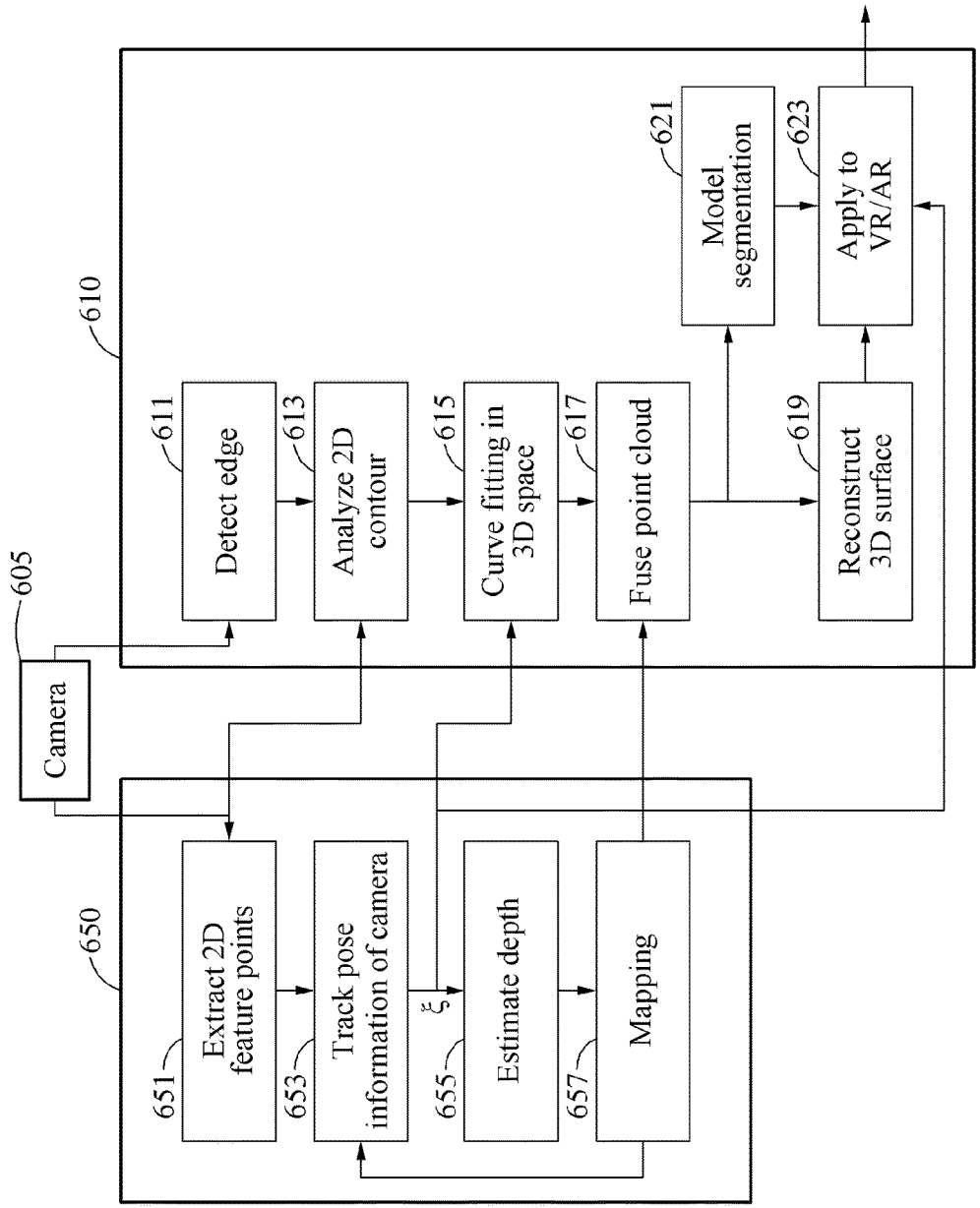
FIG. 6 is a diagram illustrating an operation of a modeling apparatus using a 3D point cloud, in accordance with an embodiment.

FIG. 6 is a diagram illustrating an example of an operation of a modeling apparatus using a 3D point cloud in accordance with an embodiment. Referring to FIG. 6, a camera 605, a modeling apparatus 610, and a feature-based vSLAM apparatus 650 are illustrated.

The modeling apparatus 610 generates a point cloud including 3D points through operations 611 through 617, and applies the point cloud to VR or AR through operations 619 through 623. The modeling apparatus 610 obtains relatively dense depth information of an edge detected in an image and/or a perimeter of the edge, thereby obtaining a 3D depth value with respect to a point that may not be obtained by the vSLAM apparatus 650, for example, a straight line component or curve component of a plane. The modeling apparatus 610 easily obtains information for modeling a target object which is an object to be modeled through the 3D depth value, for example, plane information ax+by+c=d, or curve information.

The vSLAM apparatus 650 detects a 6-DoF position of the camera 605 in real time and simultaneously generates a sparse map of an ambient space through operations 651 through 657. Since an operation of the vSLAM apparatus 650 is similar to the operation of the vSLAM apparatus 250 of FIG. 2, reference may be made to the description of FIG. 2. Hereinafter, only an operation of the vSLAM apparatus 650 which is different from that of the vSLAM apparatus 250 of FIG. 2 will be described.

The detailed operation of the modeling apparatus 610 is as follows. When an image captured by the camera 605 is received, the modeling apparatus 610 detects an edge from the image, in operation 611. In operation 611, the modeling apparatus 610 obtains a plurality of 2D contours by analyzing the edge. The modeling apparatus 610 selects 2D contours having lengths exceeding a preset 2D contour length and having curvatures exceeding a preset curvature from the obtained 2D contours.

The modeling apparatus 610 obtains a depth value z in a perimeter of coordinates (u,v) in a 2D space of the selected 2D contours. In this example, the modeling apparatus 610 obtains the depth value as follows.

In a case in which the camera 605 used to capture the image is a monocular camera, the modeling apparatus 610 obtains the depth value by stereo matching based on image information of a previous key frame, and a 6-DoF distance (rotation+translation) from the previous key frame. In a case in which the camera 605 used to capture the image is a depth camera or a stereo camera, the modeling apparatus 610 determines the depth value of the perimeter of the coordinates (u,v) in the 2D space of the selected 2D contours to be an instant depth value or depth information of the corresponding frame.

Since a 2D contour has a hierarchy, the modeling apparatus 610 may not detect an edge corresponding to a short contour which is a portion included in a long contour based on requirements for an operation time. The modeling apparatus 610 generates a contour library using 2D contours having predetermined lengths and predetermined curvatures.

In operation 613, the modeling apparatus 610 analyzes a 2D contour included in the image based on the detected edge, for example, a 2D contour of the edge, and information related to the 2D feature points extracted by the vSLAM device 650. The modeling apparatus 610 matches the 2D feature points to 2D contours. In this example, when the 2D feature points are positioned on or adjacent to the 2D contour of the edge, the modeling apparatus 610 obtains a depth value with respect to the 2D contour of the edge based on the 2D feature points. The modeling apparatus 610 analyzes whether the detected edge corresponds to the 2D contour, stores the corresponding 2D contour in the contour library, combines as necessary, and uses the combination to perform curve fitting with respect to a 3D space.

In operation 615, the modeling apparatus 610 performs curve fitting with respect to the 3D space corresponding to the 2D contour based on pose information of the camera 605 tracked by the vSLAM apparatus 650 based on the 2D feature points and the result of the analyzing the 2D contour in operation 613. Further, the modeling apparatus 610 receives a depth value estimated with respect to the 2D feature points from the vSLAM apparatus 650. The modeling apparatus 610 generates a 3D point with respect to at least a portion of the 2D contour through curve fitting based on the estimated depth value, the pose information of the camera 605 tracked based on the 2D feature points, and the result of analyzing the 2D contour.

The modeling apparatus 610 generates 3D point(s) included in the point cloud through curve fitting with respect to the 3D space corresponding to the 2D contour. In this example, the generated 3D point has a depth value, and corresponds to an additional point of the point cloud for analyzing 3D space information. In operation 617, the modeling apparatus 610 generates a 3D point cloud for modeling a map corresponding to the image by fusing the 3D point estimated as a result of mapping performed by the vSLAM apparatus 650 based on the 2D feature points and the 3D point generated by curve fitting. Here, the 3D point estimated as the result of mapping based on the 2D feature points includes 3D information, for example, 3D coordinates, of pixels constituting a 2D curvature.

In operation 619, the modeling apparatus 610 reconstructs a 3D surface of the image based on the generated 3D point cloud. Together with or separate from the reconstruction of the 3D surface of the image, the modeling apparatus 610 models a target object through model segmentation, in operation 621. The modeling apparatus 610 extracts parameters or curve parameters for modeling the target object from the 3D point cloud, and models the target object based on the parameters or curve parameters.

In operation 623, the modeling apparatus 610 models various target objects, for example, a wall and a floor, by iteratively performing the above process, and utilizes the target objects for application of AR or VR.

In an embodiment, the modeling apparatus 610 and the vSLAM apparatus 650 operate by different system clocks.

Figure 7:
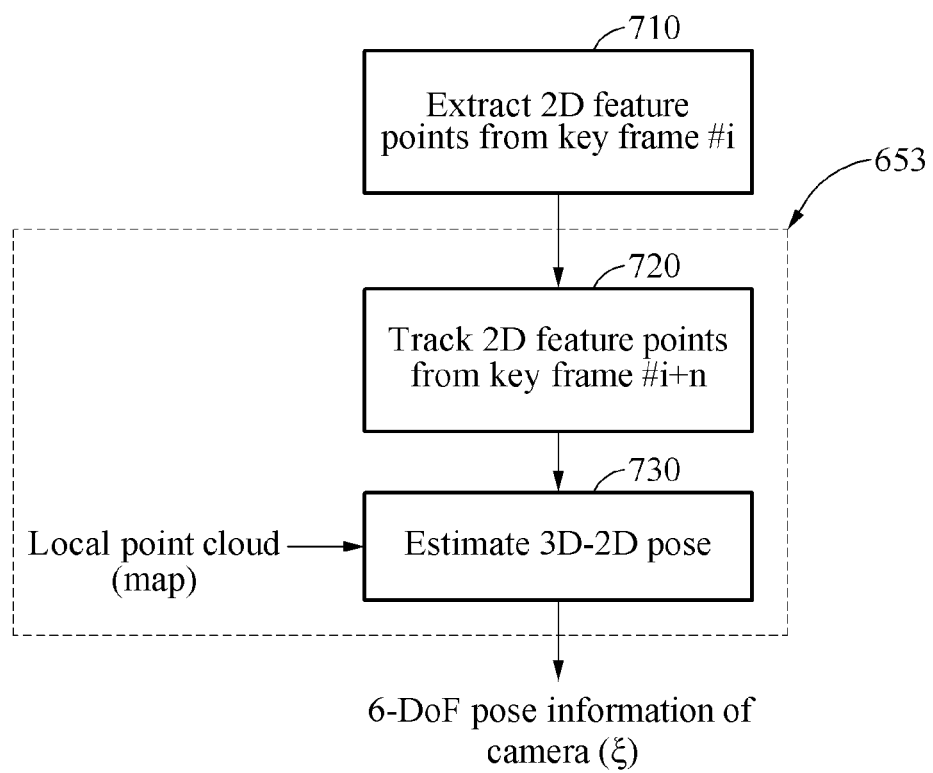
FIG. 7 is a diagram illustrating an operation of tracking a pose of a camera in the example of FIG. 6.

FIG. 7 is a diagram illustrating an example of operation 653 of tracking a pose of a camera in the example of FIG. 6. Referring to FIG. 7, an operation of a vSLAM apparatus for tracking pose information of a camera is illustrated.

When 2D feature points are extracted from a key frame i of an image captured by a camera in operation 710, the vSLAM apparatus tracks 2D feature points present in a key frame i+n, in operation 720.

In operation 730, the vSLAM apparatus estimates 3D-2D pose information of the camera based on the extracted 2D feature points and the tracked 2D feature points.

The vSLAM apparatus tracks 6-DoF pose information of the camera corresponding to the frame i+n based on the estimated pose information of the camera and a 3D point belonging to a local point cloud estimated as a final result of mapping based on the 2D feature points, that is, 3D information, for example, 3D coordinates, of pixels as final map information output and fed back by the vSLAM apparatus.

Figure 8:
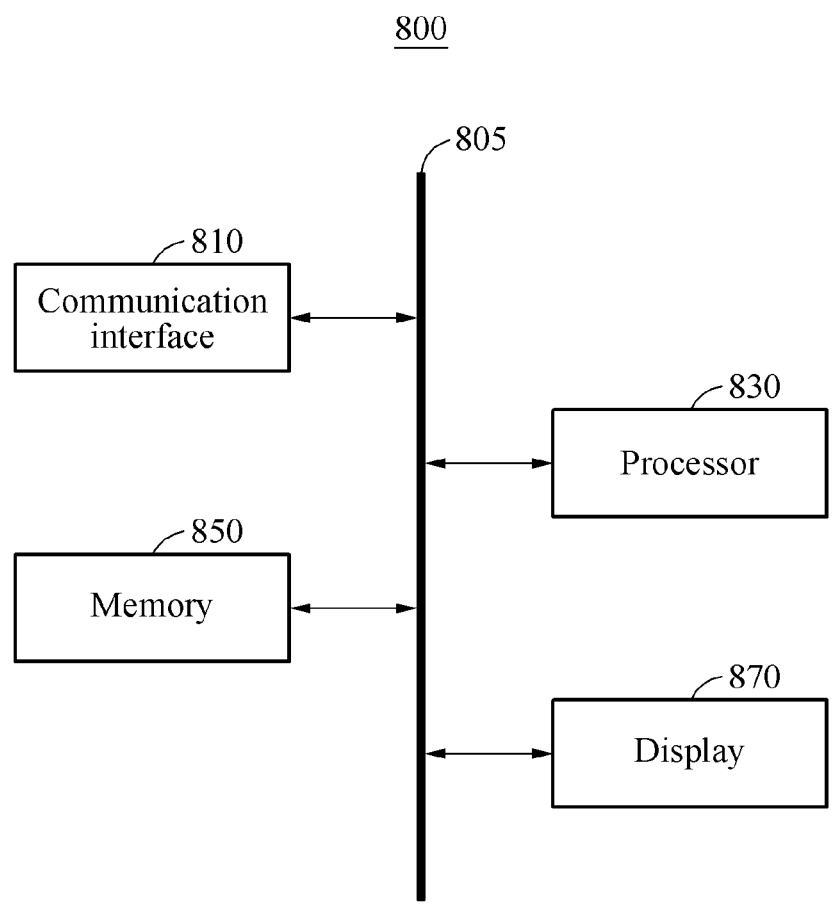
FIG. 8 is a block diagram illustrating a modeling apparatus using a 3D point cloud, in accordance with an embodiment.

FIG. 8 is a block diagram illustrating a modeling apparatus using a 3D point cloud in accordance with an embodiment. Referring to FIG. 8, a modeling apparatus 800 includes a communication interface 810, and a processor 830. The modeling apparatus 800 further includes a memory 850, and a display 870. The communication interface 810, the processor 830, the memory 850, and the display 870 communicate with each other through a communication bus 805.

The communication interface 810 receives pose information of a camera. In this example, the pose information of the camera is tracked based on 2D feature points extracted from an image captured by the camera.

The processor 830 extracts at least one region from the image captured by the camera. The processor 830 estimates first depth information of the image based on the at least one region and the pose information of the camera. The processor 830 generates a 3D point cloud for modeling a map corresponding to the image based on the first depth information.

The processor 830 detects an edge from the image captured by the camera. The processor 830 analyzes a 2D contour included in the image based on the detected edge and information related to 2D feature points received through the communication interface 810.

The processor 830 generates a 3D point with respect to at least a portion of the 2D contour by performing curve fitting with respect to a 3D space corresponding to the 2D contour based on a result of analyzing the 2D contour and the pose information of the camera. In this example, the pose information of the camera is received from an outside of the modeling apparatus 800, and is tracked based on 2D feature points. The processor 830 generates a 3D point cloud for modeling a map corresponding to the image by fusing the 3D point estimated based on the 2D feature points and the 3D point generated by curve fitting.

Further, the processor 830 performs at least one of the methods described with reference to FIGS. 1 through 7. The processor 830 executes a program, and controls the modeling apparatus 800. A program code to be executed by the processor 830 is stored in the memory 850.

The memory 850 stores the 3D point cloud generated by the processor 830. The memory 850 stores a target object modeled by the processor 830 and/or a 3D surface or plane reconstructed by the processor 830. Further, the memory 850 stores the pose information of the camera received through the communication interface 810. The memory 850 is a volatile memory or a non-volatile memory.

The display 870 displays the target object modeled by the processor 830 and/or the surface or plane reconstructed by the processor 830.

The apparatuses, units, modules, devices, and other components illustrated in FIG. 8 that perform the operations described herein with respect to FIGS. 1 through 7 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1 through 7. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art, after gaining an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A modeling method using a three-dimensional (3D) point cloud, the modeling method comprising:
    extracting at least one region from an image captured by a camera;
    receiving pose information of the camera that is tracked based on two-dimensional (2D) feature points extracted from the image;
    estimating first depth information of the image based on the at least one region and the pose information of the camera; and
    generating a 3D point cloud to model a map corresponding to the image based on the first depth information.

2. The modeling method of claim 1, wherein the pose information of the camera comprises either one or both of a key frame corresponding to the image and a pose variation that changes in response to a movement of the camera from a first position to a second position.

3. The modeling method of claim 2, wherein the estimating comprises:
    determining, based on the pose information of the camera, whether to, either one or both of, replace the key frame with a new key frame and redefine the key frame in response to the movement of the camera from the first position to the second position; and
    estimating either one or both of depth information related to the new key frame and depth information related to the redefined key frame to be the first depth information of the image based on a result of the determining.

4. The modeling method of claim 3, wherein the determining comprises:
    replacing a key frame with respect to the at least one region with the new key frame in response to the pose information of the camera that changes in response to the movement of the camera being greater than or equal to a preset pose variation; and
    redefining the key frame, with respect to the at least one region, in response to the pose information of the camera that changes in response to the movement of the camera being less than the preset pose variation.

5. The modeling method of claim 4, wherein the replacing comprises replacing depth information related to the new key frame by projecting points, corresponding to the key frame, with respect to the at least one region on the new key frame.

6. The modeling method of claim 4, wherein the redefining comprises redefining depth information related to the key frame by filtering pixels of the key frame combined with an interleaved spatial regularization through a baseline stereo comparison.

7. The modeling method of claim 1, further comprising:
    fusing the first depth information and second depth information estimated based on the 2D feature points,
    wherein the generating comprises generating the 3D point cloud to modeling the map corresponding to the image based on the fused depth information.

8. The modeling method of claim 7, wherein the fusing comprises fusing the first depth information and the second depth information by adding the second depth information to the first depth information.

9. The modeling method of claim 1, wherein the extracting comprises searching the image for at least one region including a portion having an intensity gradient variation corresponding to a first-order differential of a pixel intensity exceeding a preset reference value.

10. The modeling method of claim 1, further comprising:
    reconstructing a 3D surface of the image based on the 3D point cloud.

11. The modeling method of claim 1, further comprising:
    extracting parameters to model a target object from the 3D point cloud; and
    modeling the target object based on the parameters.

12. A non-transitory computer-readable medium storing program instructions for controlling a processor to perform the method of claim 1.

13. A modeling method using a three-dimensional (3D) point cloud, the modeling method comprising:
    detecting an edge from an image captured by a camera;
    receiving information related to two-dimensional (2D) feature points extracted from the image;
    analyzing a 2D contour included in the image based on the edge and the information related to the 2D feature points;
    receiving pose information of the camera that is tracked based on the 2D feature points;
    generating a 3D point with respect to at least a portion of the 2D contour by performing curve fitting with respect to a 3D space corresponding to the 2D contour based on a result of the analyzing and the pose information of the camera; and
    generating a 3D point cloud to model a map corresponding to the image by fusing a 3D point estimated based on the 2D feature points and the 3D point generated by curve fitting.

14. The modeling method of claim 13, wherein the analyzing comprises:
    analyzing whether 2D feature points, of which 3D coordinates are verified through depth estimation, are positioned on or adjacent to a 2D contour of the edge by matching coordinates of the 2D feature points to the edge; and
    determining 3D coordinates of 2D feature points positioned on, or adjacent to the 2D contour, based on the 2D feature points of which the 3D coordinates are verified.

15. The modeling method of claim 12, wherein the generating of the 3D point comprises:
    projecting 3D points of a 3D curve, predicted through the 2D contour on a 2D image, based on the pose information of the camera, an intrinsic parameter of the camera, and the 2D feature points of which the 3D coordinates are verified;
    calculating a coefficient of a curve parameter of the 3D curve that minimizes an error of an error function with respect to the 3D points projected on the 2D image, the error of the error function being zero when the 3D points projected on the 2D image match the 2D contour; and
    performing curve fitting with respect to the 3D space of the 2D feature points based on the coefficient of the curve parameter of the 3D curve.

16. The modeling method of claim 15, wherein the error function is based on at least one of a 3D point corresponding to any one or any combination of any two or more of a frame of the image, the intrinsic parameter of the camera, and the pose information of the camera.

17. The modeling method of claim 13, wherein the analyzing comprises:
    obtaining a set of 2D curvatures corresponding to the 2D contour by analyzing the edge;
    determining whether a curvature of the edge exceeds a preset curvature and a length of the edge exceeds a preset contour length; and generating a contour library including any one or any combination of any two or more of coordinates of 2D feature points matched to the edge, the length of the edge, and the curvature of the edge based on a result of the determining.

18. The modeling method of claim 13, further comprising: reconstructing a 3D surface of the image based on the 3D point cloud.

19. The modeling method of claim 13, further comprising: extracting parameters to model a target object from the 3D point cloud; and
modeling the target object based on the parameters.

20. A modeling apparatus using a three-dimensional (3D) point cloud, the modeling apparatus comprising:
a communication interface configured to receive pose information of a camera that is tracked based on two-dimensional (2D) feature points extracted from an image captured by the camera; and
a processor configured:
to extract at least one region from the image,
to estimate first depth information of the image based on the at least one region and the pose information of the camera, and
to generate a 3D point cloud for modeling a map corresponding to the image based on the first depth information.

21. A modeling method using a three-dimensional (3D) point cloud, the modeling method comprising:
generating a first depth information, the first depth information being generated based on an identified edge of at least a region of an image captured by a camera;
receiving an estimated second depth information, based on an identified two-dimensional (2D) point of the region of the image captured by the camera;
fusing the second depth information with the first depth information; and,
generating a 3D point cloud to model a map of the region of the image based on the fused first and second depth information.

22. The modeling method of claim 21, wherein the second depth information is generated based on a comparison of pose information of the camera and positions of identified 2D feature points amongst a plurality of images captured by the camera.

23. The modeling method of claim 21, wherein the first depth information is generated based on a detected edge within the image, the edge being analyzed as a 2D contour transformatively applied as a 3D curve through successive approximations.

24. The modeling method of claim 21, further comprising:
transformatively projecting modified imagery comprising reconstructed 3D surfaces of the image based on the map of the region of the image to generate either one or both of a virtual reality and an augmented reality view for a user.

* * * * *